United States Patent
Srivastava (10) Patent No.: US 8,420,947 B2
(45) Date of Patent: Apr. 16, 2013

(54) INTEGRATED CIRCUIT SYSTEM WITH ULTRA-LOW K DIELECTRIC AND METHOD OF MANUFACTURE THEREOF

(75) Inventor: Ravi Prakash Srivastava, Fishkill, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 315 days.

(21) Appl. No.: 12/982,363

(22) Filed: Dec. 30, 2010

(65) Prior Publication Data

US 2012/0168203 A1   Jul. 5, 2012

(51) Int. Cl.
*H05K 1/03* (2006.01)

(52) U.S. Cl.
USPC ........... 174/256; 174/250; 174/255; 430/314; 438/634; 438/636

(58) Field of Classification Search .................. 174/250, 174/255, 256, 258; 29/830, 831, 846, 847; 430/312–317; 438/634, 636, 637, 689, 700, 438/703
See application file for complete search history.

(56) References Cited

U.S. PATENT DOCUMENTS

| | | | |
|---|---|---|---|
| 5,882,489 A | 3/1999 | Bersin et al. | |
| 6,805,139 B1 | 10/2004 | Savas et al. | |
| 7,097,945 B2 | 8/2006 | Chang et al. | |
| 7,192,880 B2 | 3/2007 | Dostalik, Jr. | |
| 7,226,852 B1 | 6/2007 | Li et al. | |
| 7,253,100 B2 | 8/2007 | DellaGuardia et al. | |
| 7,282,441 B2 | 10/2007 | Fuller et al. | |
| 7,316,785 B2 | 1/2008 | Adams et al. | |
| 7,385,287 B2 | 6/2008 | Li et al. | |
| 7,563,723 B2 | 7/2009 | Abatchev et al. | |
| 2005/0003671 A1* | 1/2005 | Liu et al. | 438/695 |
| 2005/0009215 A1* | 1/2005 | Goto et al. | 438/8 |
| 2005/0032374 A1* | 2/2005 | Spandre | 438/689 |
| 2005/0164478 A1* | 7/2005 | Chan et al. | 438/585 |
| 2006/0216922 A1* | 9/2006 | Tran et al. | 438/618 |
| 2007/0281219 A1* | 12/2007 | Sandhu | 430/5 |
| 2009/0087992 A1 | 4/2009 | Srivastava et al. | |
| 2009/0166629 A1 | 7/2009 | Mehrad et al. | |
| 2009/0197420 A1 | 8/2009 | Luong et al. | |
| 2009/0197422 A1 | 8/2009 | Kang et al. | |
| 2009/0246713 A1 | 10/2009 | Zin et al. | |
| 2009/0311871 A1 | 12/2009 | Zhu et al. | |
| 2010/0105210 A1* | 4/2010 | Chen et al. | 438/702 |
| 2010/0167502 A1* | 7/2010 | Yen et al. | 438/478 |
| 2011/0124134 A1* | 5/2011 | Lin et al. | 438/14 |
| 2012/0021607 A1* | 1/2012 | Huang et al. | 438/703 |

OTHER PUBLICATIONS

Ian Morey and Ashish Asthana, "Etch Challenges of Low-k Dielectrics", 1999, pp. 71-78, vol. 42, No. 6, Publisher: Solid State Technology.

* cited by examiner

*Primary Examiner* — Hoa C Nguyen (74) *Attorney, Agent, or Firm* — Ishimaru & Associates LLP (57) ABSTRACT

A method of manufacturing an integrated circuit system includes: providing a etch stop layer; forming a layer stack over the etch stop layer with the layer stack having an anti-reflective coating layer over a low temperature oxide layer; forming a photoresist layer over the anti-reflective coating layer; forming a first resist line and a second resist line from the photoresist layer with the first resist line and the second resist line separated by a through line pitch on the anti-reflective coating layer; etching the anti-reflective coating layer using a low-pressure polymer burst with a non-oxidizing gas mixture to remove a portion of the anti-reflective coating layer; and forming a first polymer layer over the first resist line.

20 Claims, 9 Drawing Sheets

INTEGRATED CIRCUIT SYSTEM WITH ULTRA-LOW K DIELECTRIC AND METHOD OF MANUFACTURE THEREOF

TECHNICAL FIELD

The present invention relates to the field of integrated circuits and more specifically to integrated circuit system with ultra-low k dielectric.

BACKGROUND ART

Modern electronics, such as smart phones, personal digital assistants, location based services devices, digital cameras, music players, computers, routers, servers, and storage arrays, are packing more integrated circuits into an ever-shrinking physical space with expectations for decreasing cost. Both higher performance and lower power are also quintessential requirements for electronics to continue proliferation into everyday. For example, more functions are packed into a cellular phone with higher performance and longer battery life. Numerous technologies have been developed to meet these requirements.

Integrated circuits are often manufactured in and on silicon and other integrated multi-layer circuit wafers. Integrated circuits include literally millions of metal oxide semiconductor field effect transistors (MOSFET) and other active and passive circuit devices. Advances in integrated circuit technology continue to shrink the sizes of these devices and drive for higher performance with minimum power consumption. This dichotomy has inspired various approaches to solve the need for speed at lower power.

One approach involves continued shrinkage of key features of the integrated circuit technology while using new materials. This approach provides a size reduction but continues to struggle balancing cost, performance, and power.

One area where the paradox of performance, power, and cost is most evident in the modern semiconductor manufacturing era is in the need to reduce the size of transistors of an integrated circuit.

Thus, a need still remains for improving the yield, cost, and performance of the basic semiconductor structures and manufacturing to obtain maximum performance improvement, power reduction, or both. In view of the demand for faster and higher capacity semiconductor devices, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing an integrated circuit system including: providing a substrate; forming a layer stack over the substrate with the layer stack having an anti-reflective coating layer over a masking layer; forming a photoresist layer over the anti-reflective coating layer; forming a first resist line and a second resist line from the photoresist layer with the first resist line and the second resist line separated by a through line pitch on the anti-reflective coating layer; etching the anti-reflective coating layer using a low-pressure polymer burst with a non-oxidizing gas mixture to remove a portion of the anti-reflective coating layer; and forming a first polymer layer over the first resist line.

The present invention provides an integrated circuit system including: a substrate; a layer stack having an anti-reflective coating layer over a masking layer; a photoresist layer over the anti-reflective coating layer; a first resist line and a second resist line etched from the photoresist layer with the first resist line and the second resist line separated by a through line pitch on the anti-reflective coating layer; the anti-reflective coating layer etched using a low-pressure polymer burst with a non-oxidizing gas mixture to remove a portion of the anti-reflective coating layer; and a first polymer layer over the first resist line.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Figure 1:
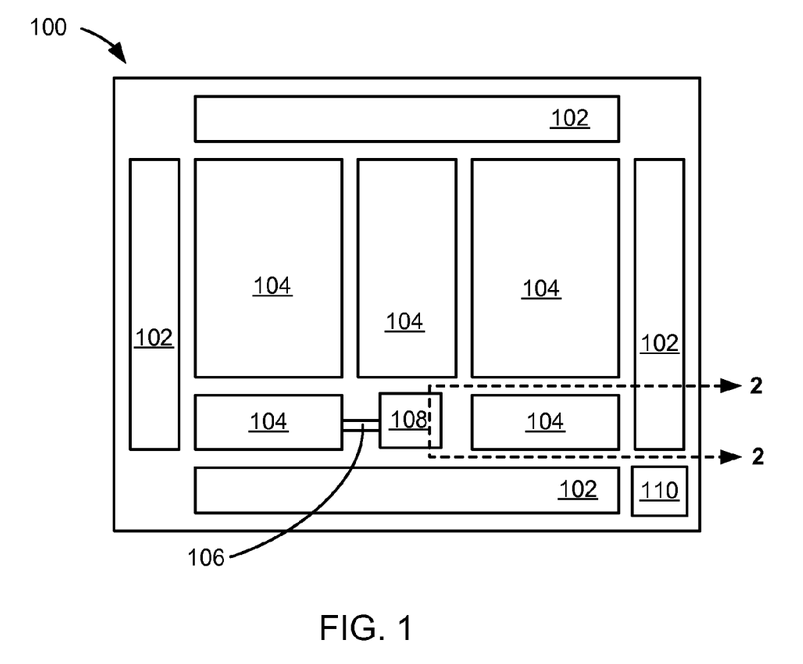
FIG. 1 is a top view of an integrated circuit system in a first embodiment of the present invention.

Referring now to FIG. 1, therein is shown a top view of an integrated circuit system 100 in a first embodiment of the present invention. The integrated circuit system 100 includes an external cell 102, such as an input/output (I/O) cell, a functional block 104, and an interconnect 106 connecting various elements of the integrated circuit system 100. The integrated circuit system 100 also includes an internal circuit element 108, such as a passive circuit element, and a peripheral circuit element 110, such as a passive circuit element. For illustrative purposes, the integrated circuit system 100 is shown having boundary or peripheral I/O ring, although it is understood that the integrated circuit system 100 may have a different configuration for the external cell 102, such as an array configuration for a land grid array.

System requirements often requires devices, such as the integrated circuit system 100, to interact with various system environments resulting in the integration of various circuit elements, such as circuits for analog or mixed-signal functions. The circuit elements for handling various system environments may reside in the peripheral region with the external cell 102, such as the peripheral circuit element 110. Other circuit elements, such as the internal circuit element 108, may reside within the core area of the integrated circuit system 100.

Figure 2:
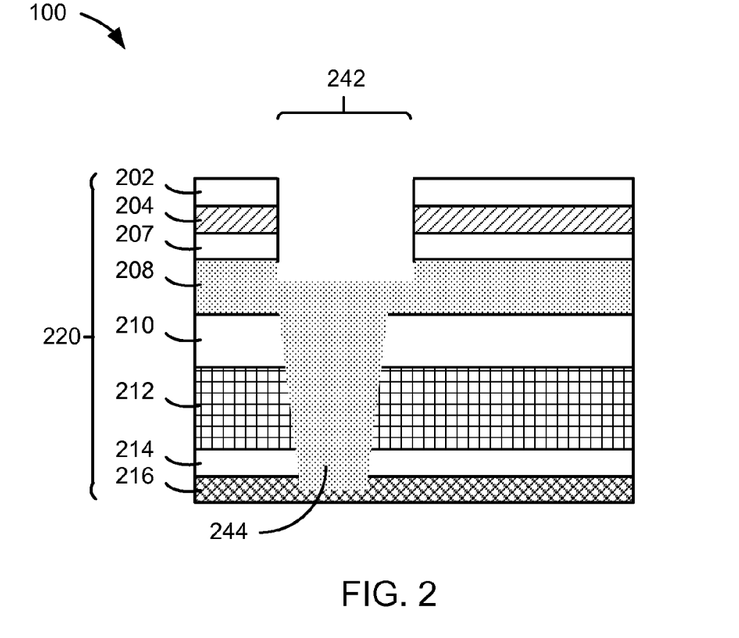
FIG. 2 is a cross-sectional view of an integrated circuit system in a first manufacturing phase.

Referring now to FIG. 2, therein is shown a cross-sectional view of the integrated circuit system 100 of FIG. 2 in a first manufacturing phase.

The integrated circuit system 100 includes a etch stop layer 216, such as a copper capping layer or silicon carbide (SiC) layer, and a layer stack 220 in an Anti-Reflective Coating/Low Temperature Oxide (ARC/LTO) open stage. The layer stack 220 is the set of layers of semiconductor materials depositing on top of a substrate to create a circuit element such as a transistor.

The integrated circuit system 100 can be manufactured using a Via First Trench Last (VFTL) scheme. The VFTL scheme can have multiple stages of processing including a post via Reactive Ion Etching stage, a post-lithography stage, the ARC/LTO open stage, and other variable stages. Each stage includes further processing of the integrated circuit system 100. The present invention depicts on the post via RIE stage, the post-lithographic stage, and the ARC/LTO open stage.

During the post via RIE stage, the integrated circuit system 100 includes the etch stop layer 216 with the layer stack 220 over a portion of the etch stop layer 216. The layer stack 220 includes an adhesion layer 214, such as an oxide-like layer, formed over the etch stop layer 216, an ultra-low k dielectric layer 212 (ULK) formed over the adhesion layer 214, and a hardmask layer 210 (HM) formed over the ultra-low k dielectric layer 212.

The hardmask layer 210, such as a metal layer, is used to preserve the patterning of smaller features than can be preserved using an organic etch mask. The hardmask layer 210 can be etched using a hardmask pattern to create an opening for a via or a trench. A reactive ion etching process (RIE) can be used to create a via recess 244 extending though the hardmask layer 210 and into the ultra-low k dielectric layer 212, the adhesion layer 214, and stopping on the etch stop layer 216. A planarizing layer 208 (OPL) can be formed over the hardmask layer 210 and fill the via recess 244. The planarizing layer 208 is used to cover the hardmask layer 210 and provide a smooth surface for further layers. For example, the planarizing layer 208 can include an organic planarizing layer.

The ultra-low k dielectric layer 212 is comprised of a material with an ultra-low dielectric constant (k) relative to the dielectric constant of silicon dioxide. The dielectric constant of silicon dioxide is approximately 3.9. Ultra-low k materials typically have a k value of less than 2.5. Ultra-low k materials can include organosilicates, porous silicon dioxide, polymer dielectrics, doped silicon dioxide, or a combination thereof.

During the post-lithographic stage, the layer stack 220 can include a low temperature oxide layer 207 (LTO) formed over the planarizing layer. The layer stack 220 can also include an anti-reflective coating layer 204 (ARC) formed over the low temperature oxide layer 207, and a photoresist layer 202 formed over the anti-reflective coating layer 204.

The layer stack 220 can be etched by a lithographic process to create openings in the photoresist layer 202 based on the pattern mask. The pattern mask defines the integrated circuit to be created by the photolithographic process.

During the ARC/LTO open stage, further etching processes can create a first recess 242 extending through the photoresist layer 202 and into the anti-reflective coating layer 204, the low temperature oxide layer 207, and the planarizing layer 208. The opening in the planarizing layer 208 can include the first recess 242 in the planarizing layer 208 that does penetrate the planarizing layer 208.

The size of elements such as resist lines etched on the layer stack 220 can be characterized by a critical dimension (CD). The critical dimension is the smallest geometrical features which can be formed during semiconductor device manufacturing using a given semiconductor technology. Often during the process of reducing the critical dimension, an unwanted side-effect is the increase in the line edge roughness (LER). Irregularities along the sides of the formed geometric features can increase the line edge roughness and can lead to unexpected errors including short circuits. The line edge roughness can be expressed as the deviation of a line edge from a straight line.

Current technology requirements demand a shrinking of the CD during the reactive ion etching process, but still keeping the minimum CD bias to avoid an overall increase in copper line resistance. Meeting CD bias targets are challenging for reactive ion etching processes.

For VFTL scheme, the present invention performs most of the shrinking of the CD in the ARC/LTO open stage. Shrinking the CD during the ARC/LTO open stage can result in high CD bias with varying pitch features. The polymer deposition is more on wider features. Resist footing and thinner resists add to the CD bias when less aggressive ARC open processes are used to minimize line edge roughness and the resist budget.

In addition, excessive shrink requirements of CD are often due to the ultra-low k material damage, bigger incoming lithographic CD for printability and wider lithographic process margins, and CD blow-up beyond the dilute hydrogen fluoride (DHF) cleaning process. Shrinking the CD also degrades the line edge roughness.

Figure 3:
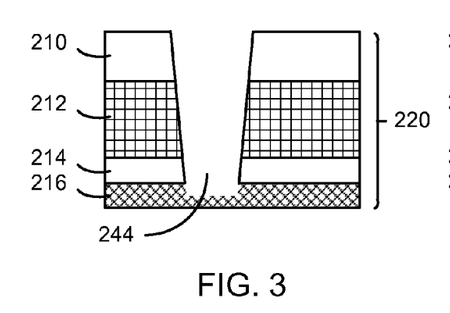
FIG. 3 is a cross-sectional view of the integrated circuit system in a second manufacturing phase.

Referring now to FIG. 3, therein is shown a cross-sectional view of the integrated circuit system 100 of FIG. 1 in a second manufacturing phase. The integrated circuit system 100 can include the layer stack 220 of FIG. 2 in a post-via RIE stage.

The integrated circuit system 100 includes the etch stop layer 216 of FIG. 2 with the layer stack 220 over a portion of the etch stop layer 216. The layer stack 220 includes the adhesion layer 214 of FIG. 2 formed over the etch stop layer 216.

The layer stack 220 includes the ultra-low k dielectric layer 212 of FIG. 2 formed over the adhesion layer 214. The layer stack 220 include the hardmask layer 210 of FIG. 2 formed over the ultra-low k dielectric layer 212.

The layer stack 220 includes the via recess 244 of FIG. 2 extending from the hardmask layer 210 to the etch stop layer 216. The via recess 244 extends through the hardmask layer 210, the ultra-low k dielectric layer 212, the adhesion layer 214, and a portion of the etch stop layer 216. The via recess 244 extends through a portion of the etch stop layer 216, but does not penetrate completely through the etch stop layer 216.

The via recess 244 can be formed in a variety of methods. For example, the via recess 244 can be formed using a reactive ion etching (RIE) process. In another example, the via recess 244 can be formed using a wet etching process.

Figure 4:
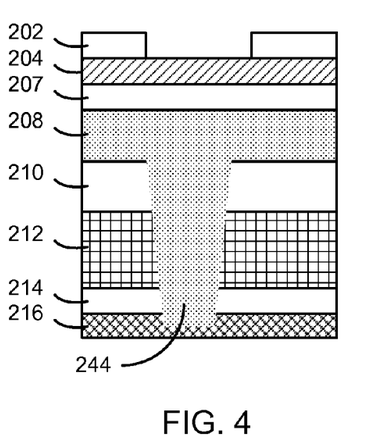
FIG. 4 is a cross-sectional view of the integrated circuit system in a third manufacturing phase.

Referring now to FIG. 4, therein is shown a cross-sectional view of the integrated circuit system 100 of FIG. 1 in a third manufacturing phase. The integrated circuit system 100 of FIG. 1 can include the layer stack 220 of FIG. 2 in a post lithographic stage.

The integrated circuit system 100 includes the etch stop layer 216 with the layer stack 220 over a portion of the etch stop layer 216. The layer stack 220 includes the adhesion layer 214 formed over the etch stop layer 216.

The layer stack 220 includes the ultra-low k dielectric layer 212 formed over the adhesion layer 214. The layer stack 220 include the hardmask layer 210 formed over the ultra-low k dielectric layer 212.

The layer stack 220 includes the via recess 244 of FIG. 2 extending from the hardmask layer 210 to the etch stop layer 216. The via recess 244 can extend through a portion of the etch stop layer 216, but does not penetrate completely through the etch stop layer 216.

The layer stack 220 can include the planarizing layer 208 of FIG. 2 formed over the hardmask layer 210. The planarizing layer 208 can fill the via recess 244.

The layer stack 220 can include the low temperature oxide layer 207 of FIG. 2 formed over the planarizing layer 208. The layer stack 220 can also include the anti-reflective coating layer 204 of FIG. 2 formed over the low temperature oxide layer 207. The layer stack 220 can include the photoresist layer 202 formed over the anti-reflective coating layer 204.

The layer stack 220 can be etched by a lithographic process to create openings in the photoresist layer 202 based on the pattern mask. The pattern mask defines the integrated circuit to be created by the photolithographic process.

Figure 5:
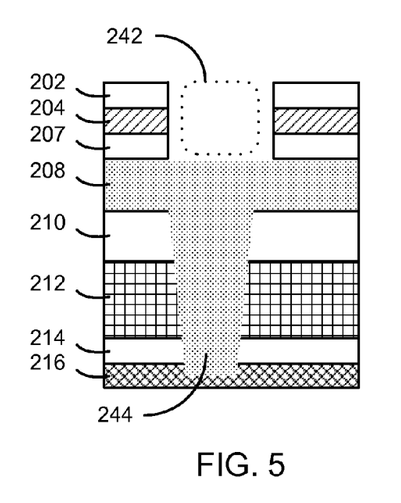
FIG. 5 is a cross-sectional view of the integrated circuit system in a fourth manufacturing phase.

Referring now to FIG. 5, therein is shown a cross-sectional view of the integrated circuit system 100 of FIG. 1 in a fourth manufacturing phase. The integrated circuit system 100 can include the layer stack 220 of FIG. 2 in an ARC/LTO open stage.

The integrated circuit system 100 includes the etch stop layer 216 with the layer stack 220 over a portion of the etch stop layer 216. The layer stack 220 includes the adhesion layer 214 formed over the etch stop layer 216.

The layer stack 220 includes the ultra-low k dielectric layer 212 formed over the adhesion layer 214. The layer stack 220 include the hardmask layer 210 formed over the ultra-low k dielectric layer 212.

The layer stack 220 includes the via recess 244 extending from the hardmask layer 210 to the etch stop layer 216. The via recess 244 can extend through a portion of the etch stop layer 216, but does not penetrate completely through the etch stop layer 216.

The layer stack 220 can include the planarizing layer 208 formed over the hardmask layer 210. The planarizing layer 208 can fill the via recess 244.

The layer stack 220 can include the low temperature oxide layer 207 formed over the planarizing layer 208. The layer stack 220 can include the anti-reflective coating layer 204 formed over the low temperature oxide layer 207. The layer stack 220 can include the photoresist layer 202 formed over the anti-reflective coating layer 204.

The photoresist layer 202 can be etched by a lithographic process to create openings in the photoresist layer 202 based on the pattern mask. The pattern mask defines the integrated circuit to be created by the photolithographic process.

During the ARC/LTO open stage, the layer stack 220 can be etched using a polymer burst process. The polymer burst process is defined in a later section. The polymer burst process can etch the layer stack 220 to remove a portion of the anti-reflective coating layer 204, while not etching the low temperature oxide layer 207 so a first recess 242 should stop at the low temperature oxide layer 207.

The polymer burst process can be used with both the back end of the line (BEOL) and the front end of the line (FEOL) processes. The FEOL processes can include transistor active area etch (Rx), Contact etch (CA) process, or any combination thereof.

The first recess 242 can be extended through the anti-reflective coating layer 204 and into the low temperature oxide layer 207 by an etching stage after the polymer burst process. The polymer burst process can also remove a portion of the photoresist layer 202.

Figure 6:
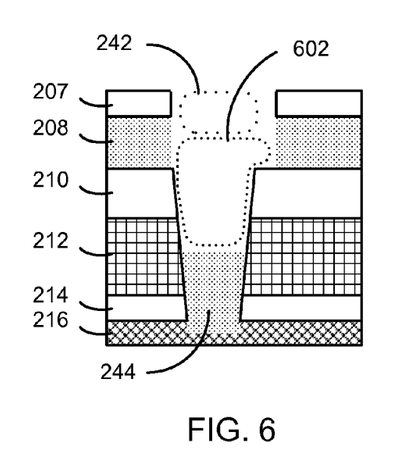
FIG. 6 is a cross-sectional view of the integrated circuit system in a fifth manufacturing phase.

Referring now to FIG. 6, therein is shown a cross-sectional view of the integrated circuit system 100 of FIG. 1 in a fifth manufacturing phase. The integrated circuit system 100 can include the layer stack 220 of FIG. 2 in an OPL open stage.

The integrated circuit system 100 includes the etch stop layer 216 with the layer stack 220 over a portion of the etch stop layer 216. The layer stack 220 includes the adhesion layer 214 formed over the etch stop layer 216.

The layer stack 220 includes the ultra-low k dielectric layer 212 formed over the adhesion layer 214. The layer stack 220 include the hardmask layer 210 formed over the ultra-low k dielectric layer 212.

The layer stack 220 includes the via recess 244 extending from the hardmask layer 210 to the etch stop layer 216. The via recess 244 can extend through a portion of the etch stop layer 216, but does not penetrate completely through the etch stop layer 216.

The layer stack 220 can include the planarizing layer 208 formed over the hardmask layer 210. The planarizing layer 208 can fill the via recess 244. The layer stack 220 can include the low temperature oxide layer 207 formed over the planarizing layer 208.

During the OPL open stage, the layer stack 220 can be etched to remove the photoresist layer 202 of FIG. 5 and the anti-reflective coating layer 204 of FIG. 5.

The layer stack 220 can be etched to create a second recess 602. The second recess 602 includes the portion of the planarizing layer 208 between the first recess 242 and the hardmask layer 210. The second recess 602 also includes the portion of the planarizing layer 208 within the via recess 244 and extending from the top of the hardmask layer 210 and into the ultra-low k dielectric layer 212. The second recess 602 does not extend penetrate the ultra-low k dielectric layer 212.

Figure 7:
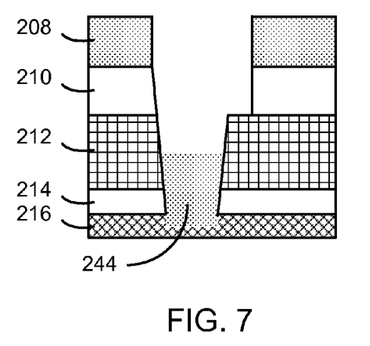
FIG. 7 is a cross-sectional view of the integrated circuit system in a sixth manufacturing phase.

Referring now to FIG. 7, therein is shown a cross-sectional view of the integrated circuit system 100 of FIG. 1 in a sixth manufacturing phase. The integrated circuit system 100 can include the layer stack 220 of FIG. 2 in an HM open stage.

The integrated circuit system 100 includes the etch stop layer 216 with the layer stack 220 over a portion of the etch stop layer 216. The layer stack 220 includes the adhesion layer 214 formed over the etch stop layer 216.

FIG. 7 depicts the ultra-low k dielectric layer 212 formed over the adhesion layer 214. The adhesion layer 214 can be formed in a single step by forming the ultra-low k dielectric layer 212 over the etch stop layer 216. The adhesion layer 214 provides a good adhesion of the ultra-low k dielectric layer 212 to the etch stop layer 216. FIG. 7 also depict the hardmask layer 210 formed over the ultra-low k dielectric layer 212. FIG. 7 further depict can include the planarizing layer 208 formed over the hardmask layer 210.

The layer stack 220 of FIG. 2 includes the via recess 244 extending from the hardmask layer 210 to the etch stop layer 216. The via recess 244 can extend through a portion of the etch stop layer 216, but does not penetrate completely through the etch stop layer 216. The planarizing layer 208 can fill a portion of the via recess 244.

During the HM open stage, the layer stack 220 can be etched to remove the low temperature oxide layer 207 of FIG. 6. The layer stack can be etched to remove the hardmask layer 210 between the first recess 242 and the ultra-low k dielectric layer 212. The layer stack 220 can be etched to remove a portion of the planarizing layer 208 inside the via recess 244.

Figure 8:
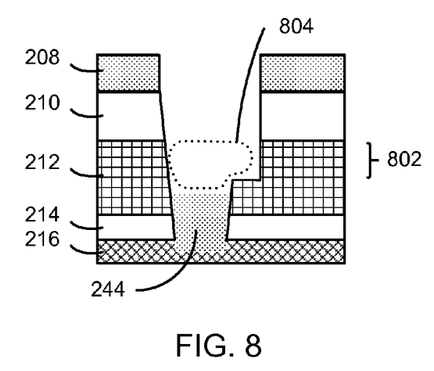
FIG. 8 is a cross-sectional view of the integrated circuit system in a seventh manufacturing phase.

Referring now to FIG. 8, therein is shown a cross-sectional view of the integrated circuit system 100 of FIG. 1 in a seventh manufacturing phase. The integrated circuit system 100 can include the layer stack 220 of FIG. 2 in a main etch stage.

The integrated circuit system 100 includes the etch stop layer 216 with the layer stack 220 over a portion of the etch stop layer 216. The layer stack 220 includes the adhesion layer 214 formed over the etch stop layer 216.

The layer stack 220 includes the ultra-low k dielectric layer 212 formed over the adhesion layer 214. The layer stack 220 include the hardmask layer 210 formed over the ultra-low k dielectric layer 212. The layer stack 220 can include the planarizing layer 208 formed over the hardmask layer 210.

The layer stack 220 includes the via recess 244 extending from the hardmask layer 210 to the etch stop layer 216. The via recess 244 can extend through a portion of the etch stop layer 216, but does not penetrate completely through the etch stop layer 216. The planarizing layer 208 can fill a portion of the via recess 244.

During the main etch stage, the layer stack 220 can be etched to remove a portion of the ultra-low k dielectric layer 212 through the opening of the first recess 242 of FIG. 5 to a depth of a first ultra-low k level 802 into the ultra-low k dielectric layer 212. The layer stack 220 can be etched to remove a portion of the planarizing layer 208 inside the via recess 244. In an illustrating example, the layer stack 220 can be etched to create a third recess 804.

Figure 9:
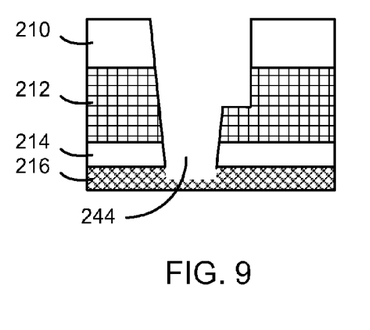
FIG. 9 is a cross-sectional view of the integrated circuit system in a eighth manufacturing phase.

Referring now to FIG. 9, therein is shown a cross-sectional view of the integrated circuit system 100 of FIG. 1 in a eighth manufacturing phase. The integrated circuit system 100 can include the layer stack 220 of FIG. 2 in an ash stage (OPL Strip).

The integrated circuit system 100 includes the etch stop layer 216 with the layer stack 220 over a portion of the etch stop layer 216. The layer stack 220 includes the adhesion layer 214 formed over the etch stop layer 216.

The layer stack 220 includes the ultra-low k dielectric layer 212 formed over the adhesion layer 214. The layer stack 220 include the hardmask layer 210 formed over the ultra-low k dielectric layer 212.

The layer stack 220 includes the via recess 244 extending from the hardmask layer 210 to the etch stop layer 216. The via recess 244 can extend through a portion of the etch stop layer 216, but does not penetrate completely through the etch stop layer 216. The planarizing layer 208 can fill a portion of the via recess 244. The layer stack 220 includes the second recess 602 of FIG. 6. The layer stack 220 includes the third recess 804 of FIG. 8 etched from the ultra-low k dielectric layer 212.

During the ash stage (OPL Strip stage), the layer stack 220 can be etched to remove the planarizing layer 208 of FIG. 8 and the planarizing layer 208 within the via recess 244.

Figure 10:
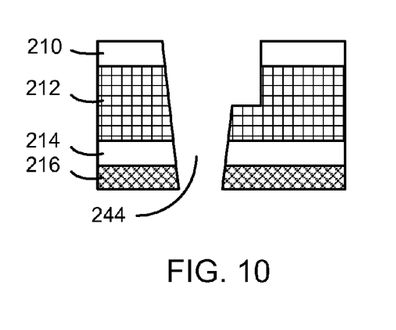
FIG. 10 is a cross-sectional view of the integrated circuit system in a ninth manufacturing phase.

Referring now to FIG. 10, therein is shown a cross-sectional view of the integrated circuit system 100 of FIG. 1 in a ninth manufacturing phase. The integrated circuit system 100 can include the layer stack 220 of FIG. 2 in a finish etch stage.

The integrated circuit system 100 includes the etch stop layer 216 with the layer stack 220 over a portion of the etch stop layer 216. The layer stack 220 includes the adhesion layer 214 formed over the etch stop layer 216.

The layer stack 220 includes the ultra-low k dielectric layer 212 formed over the adhesion layer 214. The layer stack 220 include the hardmask layer 210 formed over the ultra-low k dielectric layer 212.

The layer stack 220 includes the via recess 244 extending from the hardmask layer 210 to the etch stop layer 216. The via recess 244 can extend through a portion of the etch stop layer 216, but does not penetrate completely through the etch stop layer 216. The planarizing layer 208 can fill a portion of the via recess 244. The layer stack 220 includes the second recess 602 of FIG. 6. The layer stack 220 includes the third recess 804 of FIG. 8 etched from the ultra-low k dielectric layer 212.

During the finish etch stage, the layer stack 220 can be etched to remove a portion of the hardmask layer 210. The layer stack 220 can be etched to remove a portion of the etch stop layer 216 extending the via recess 244 through the etch stop layer 216.

Figure 11:
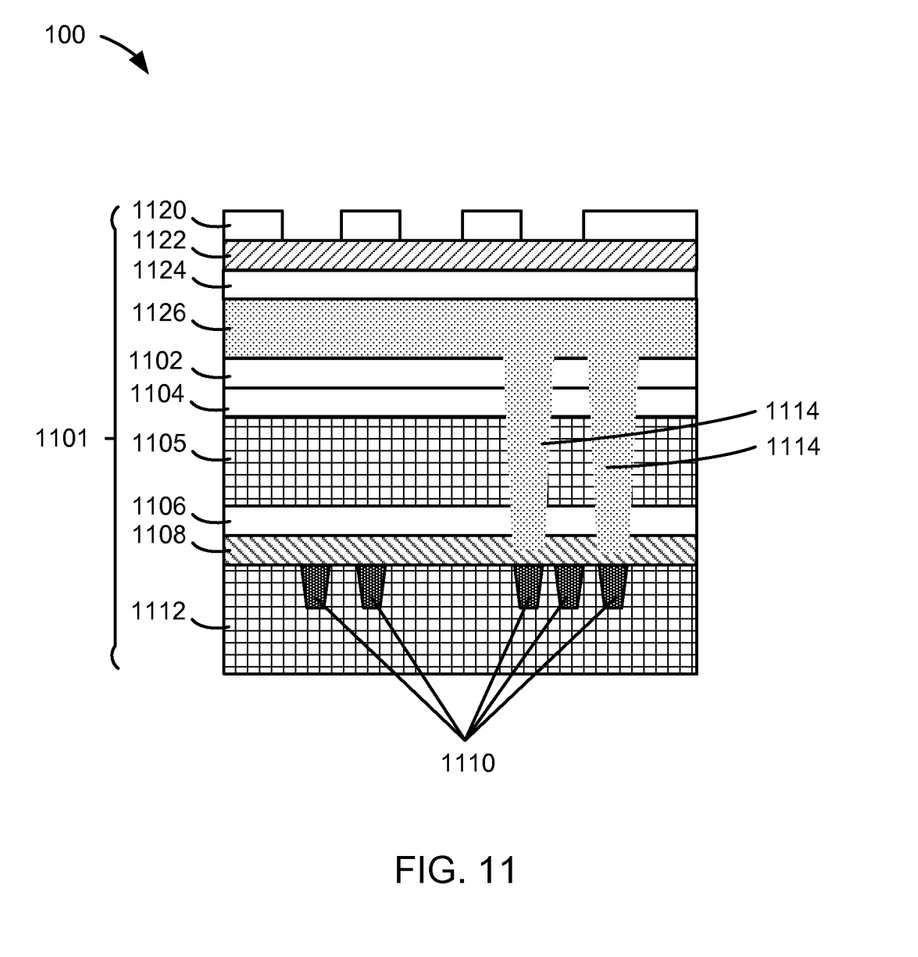
FIG. 11 is a cross-sectional view of the integrated circuit system in a second embodiment of the present invention.

Referring now to FIG. 11, therein is show a cross-sectional view of the integrated circuit system 100 of FIG. 1 in a second embodiment of the present invention. The integrated circuit system 100 can include a layer stack 1101.

The layer stack 1101 includes a first ultra-low k dielectric layer 1112. The layer stack 1101 includes a metal line 1110 formed within the first ultra-low k dielectric layer 1112. The layer stack 1101 includes a copper cap layer 1108 (N-BLOK or SiC) formed over the metal line 1110 and formed over the first ultra-low k dielectric layer 1112.

The first ultra-low k dielectric layer 1112 is comprised of a material with an ultra-low dielectric constant (k) relative to the dielectric constant of silicon dioxide, such as organosilicates, porous silicon dioxide, polymer dielectrics, doped silicon dioxide, or a combination thereof. The metal line 1110 is for conducting signals. For example, the metal line 1110 can be comprised of copper.

The copper cap layer 1108 is for preventing the diffusion of copper to upper dielectric layers in the layer stack 1101. The copper cap layer 1108 can prevent the shorting of metals lines, such as the metal line 1110 in the layer stack 1101. For example, the copper cap layer 1108 can be comprised of SiCN, SiC, or N-BLOK. The copper cap layer 1108 can act as an etch stop layer during the via reactive ion etching process.

The layer stack 1101 includes an etch stop layer 1106 (ES1). The etch stop layer 1106 can be formed during the deposition of a second ultra-low k dielectric layer 1105. over the copper cap layer 1108. The layer stack 1101 includes the second ultra-low k dielectric layer 1105 formed over the etch stop layer 1106. The etch stop layer 1106 is to provide better adhesion between the copper cap layer 1108 and the second ultra-low k dielectric layer 1105.

The second ultra-low k dielectric layer 1105 is comprised of a material with an ultra-low dielectric constant (k) relative to the dielectric constant of silicon dioxide, such as organosilicates, porous silicon dioxide, polymer dielectrics, doped silicon dioxide, or a combination thereof. For example, the second ultra-low k dielectric layer 1105 can have a dielectric constant (k) of approximately 2.5.

The layer stack 1101 includes a hardmask layer 1104 formed over the second ultra-low k dielectric layer 1105. The layer stack 1101 includes an insulator precursor layer 1102 formed over the hardmask layer 1104.

The insulator precursor layer 1102 is for forming an insulating layer, such as silicon dioxide. The insulator precursor layer 1102 can be comprised of tetraethyl orthosilicate (TEOS). The hardmask layer 1104, such as an oxide layer, is used to preserve the patterning of smaller features than can be preserved using an organic etch mask. The hardmask layer 1104 is less damaging to the second ultra-low k dielectric layer 1105.

The layer stack 1101 can include a planarizing layer 1126 formed over the insulator precursor layer 1102. The layer stack 1101 can include a masking layer 1124 formed over the insulator precursor layer 1102.

The planarizing layer 1126 is used to cover the insulator precursor layer 1102 and provide a smooth surface for further layers. The masking layer 1124 is for insulating between an anti-reflective coating layer 1122 and the planarizing layer 1126.

The layer stack 1101 can include a via recess 1114. The via recess 1114 can be formed by etching an opening though the insulator precursor layer 1102, the hardmask layer 1104, the second ultra-low k dielectric layer 1105, the etch stop layer 1106, and a portion of the copper cap layer 1108. The planarizing layer 1126 can be formed over the via recess 1114 and can fill the via recess 1114. The via recess 1114 is for forming features, such as openings between elements.

The layer stack 1101 can include the anti-reflective coating layer 1122 formed over the masking layer 1124. The layer stack 1101 can include a photoresist layer 1120 formed over the anti-reflective coating layer 1122.

The anti-reflective coating layer 1122 is for reducing reflections and minimizing standing wave effects. The photoresist layer 1120 is for receiving the pattern mask to define the components of the integrated circuit system 100. The photoresist layer 1120 can be etched by a lithographic process to create openings in the photoresist layer 202 based on the pattern mask. The pattern mask defines the integrated circuit to be created by the photolithographic process.

Figure 12:
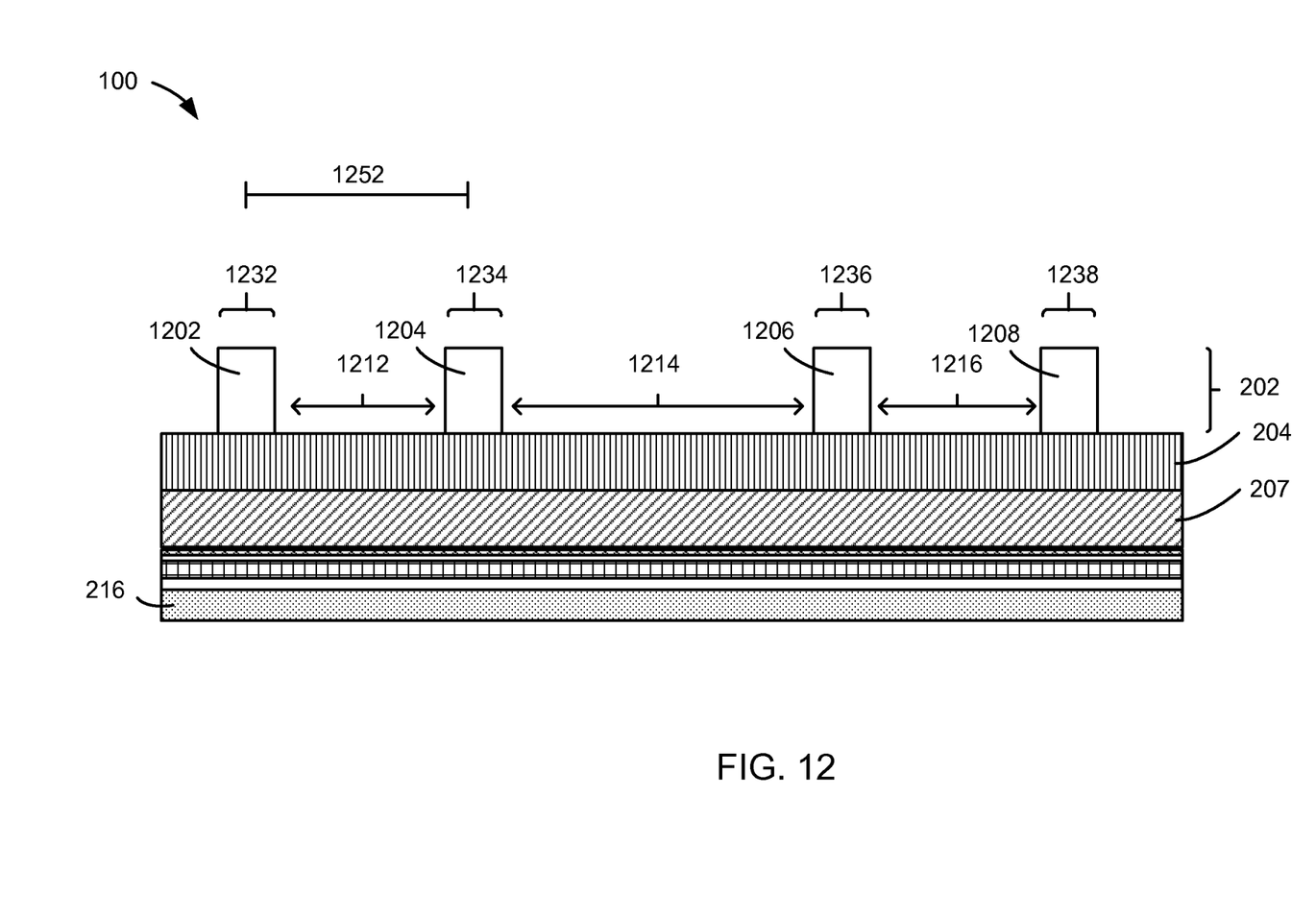
FIG. 12 is a cross-sectional view of an integrated circuit system in a third embodiment of the present invention.

Referring now to FIG. 12, therein is shown a cross-sectional view of the integrated circuit system 100 in a third embodiment of the present invention. The integrated circuit system 100 includes the etch stop layer 216 of FIG. 2.

The integrated circuit system 100 includes the photoresist layer 202 over a portion of the anti-reflective coating layer 204. The anti-reflective coating layer 204 is over the low temperature oxide layer 207 of FIG. 2.

The photoresist layer 202 can be etched to create a first resist line 1202, a second resist line 1204, a third resist line 1206, and a fourth resist line 1208. The resist lines are used to cover a portion of the anti-reflective coating layer 204 to protect the anti-reflective coating layer 204 from further etching in later stages.

The first resist line 1202 includes a first resist line width 1232. The second resist line 1204 includes a second resist line width 1234. The third resist line 1206 includes a third resist line width 1236. The fourth resist line 1208 includes a fourth resist line width 1238.

The first resist line 1202 is separated from the second resist line 1204 by a first resist line opening 1212. The second resist line 1204 is separated from the third resist line 1206 by a second opening 1214. The third resist line 1206 is separated from the fourth resist line 1208 by a third resist line opening 1216.

A through line pitch 1252 is the distance between the first resist line 1202 and the second resist line 1204. The through line pitch 1252 represents the distance between the center lines of two adjacent resist lines or other geometric structures on the etch stop layer 216.

Figure 13:
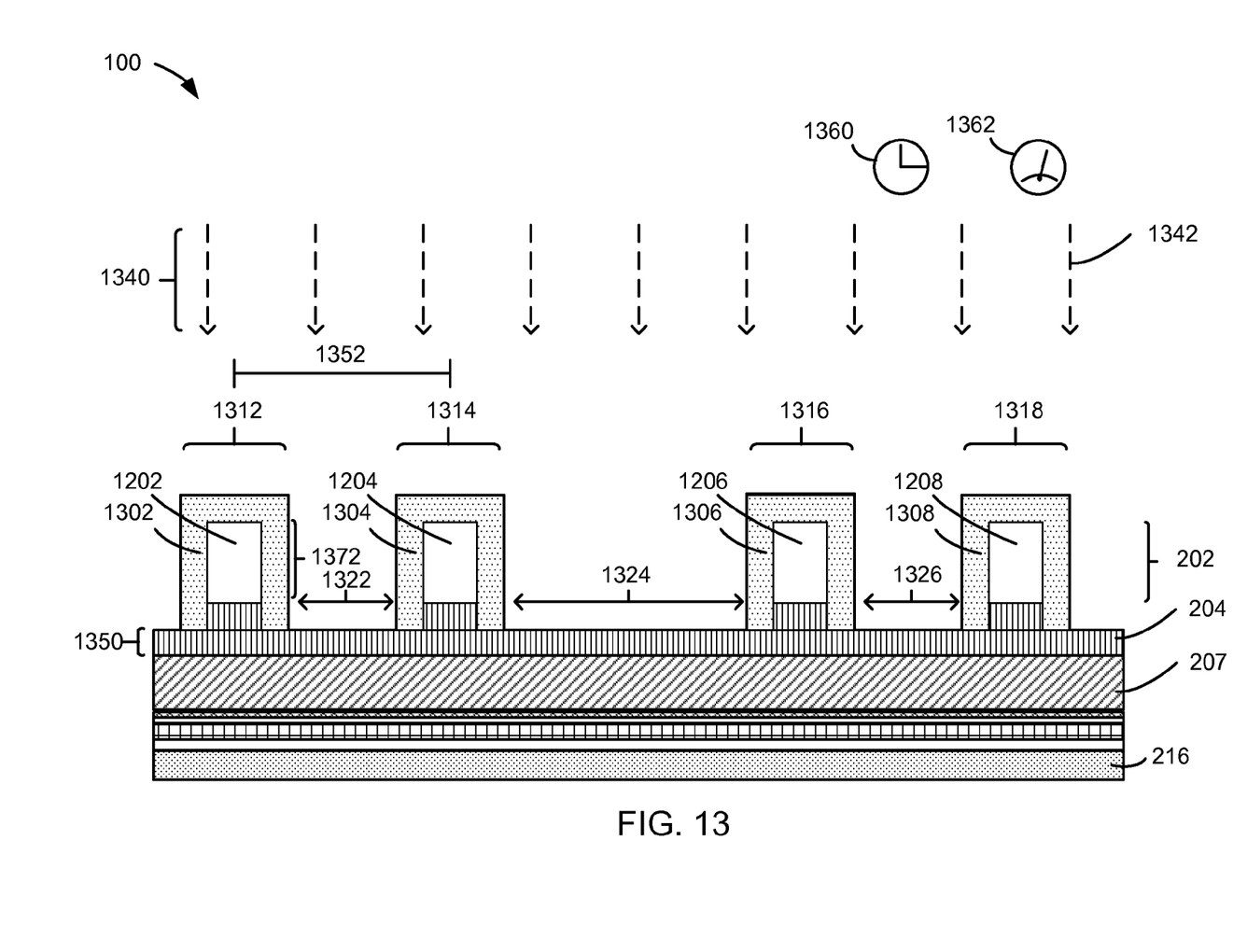
FIG. 13 is a cross-sectional view of the integrated circuit system in a fourth embodiment of the present invention.

Referring now to FIG. 13, therein is shown a cross-sectional view of the integrated circuit system 100 of FIG. 2 in a fourth embodiment of the present invention. The integrated circuit system 100 includes the etch stop layer 216 in the ARC/LTO open stage. The ARC/LTO open stage occurs when the anti-reflective coating layer 204 is etched.

The integrated circuit system 100 includes the photoresist layer 202 over a portion of the anti-reflective coating layer 204. The anti-reflective coating layer 204 is over the low temperature oxide layer 207 of FIG. 2. The photoresist layer 202 includes the first resist line 1202, the second resist line 1204, the third resist line 1206, and the fourth resist line 1208.

During the ARC/LTO open stage, the layer stack 220 can be etched by a low-pressure polymer burst 1340. The details of the low-pressure polymer burst 1340 are provided in a later section. The low-pressure polymer burst 1340 can deposit a first polymer layer 1302 over the first resist line 1202, while etching the anti-reflective coating layer 204 adjacent to the first resist line 1202 and the second resist line 1204. The first polymer layer 1302 is for covering the first resist line 1202 with a layer of the material from the low-pressure polymer burst 1340 to increase the effective size of the first resist line 1202.

Manufacturing irregularities in the formation of the first resist line 1202 can result in a rough edge along the sides of the first resist line 1202. The formation of the first polymer layer 1302 over the first resist line 1202 can reduce the line edge roughness (LER) attributed to the first resist line 1202.

The first polymer layer 1302 is formed over the first resist line 1202. The first polymer layer 1302 can include a passivation layer 1372 on the side of the first polymer layer 1302. The passivation layer 1372 is a layer of material formed during the deposition of the first polymer layer 1302 that prevents sidewall damage during the etching process. The first polymer layer 1302 has a first polymer width 1312. The first polymer layer 1302 is separated from a second polymer layer 1304 by a first polymer opening 1322. The second polymer layer 1304 is for covering the second resist line 1204 with a layer of the material from the low-pressure polymer burst 1340 to increase the effective size of the second resist line 1204.

The second polymer layer 1304 is formed over the second resist line 1204. The second polymer layer 1304 has a second polymer width 1314. The second polymer layer 1304 is separated from a third polymer layer 1306 by a second polymer opening 1324. The third polymer layer 1306 is for covering the third resist line 1206 with a layer of the material from the low-pressure polymer burst 1340 to increase the effective size of the third resist line 1206.

The third polymer layer 1306 is formed over the third resist line 1206. The third polymer layer 1306 has a third polymer width 1316. The third polymer layer 1306 is separated from a fourth polymer layer 1308 by a third polymer opening 1326. The fourth polymer layer 1308 is for covering the fourth resist line 1208 with a layer of the material from the low-pressure polymer burst 1340 to increase the effective size of the fourth resist line 1208.

The fourth polymer layer 1308 is formed over the fourth resist line 1208. The fourth polymer layer 1308 has a fourth polymer width 1318.

The critical dimension is the smallest geometrical features, such as the width of interconnect lines, contacts, trenches, etc., which can be formed during semiconductor device manufacturing using given semiconductor technology. In the present invention, the critical dimension can include the first resist line opening 1222 and the first polymer opening 1322.

A through line pitch 1352 is the distance between two adjacent resist lines. A through line pitch CD bias is the difference in the through line pitch 1352 after the first polymer layer 1302 is formed over the first resist line 1202. The first polymer opening 1322 is less than the first resist line opening 1222 of FIG. 12 indicating that the critical dimension of the first polymer opening 1322 has been shrunk. However, the through line pitch 1352 is the same as the through line pitch 1252 of FIG. 12 and the through line pitch CD bias remains unchanged.

The through pitch CD bias for varying resist line widths is more consistent with the low-pressure polymer burst 1340 than without. The use of the low-pressure polymer burst 1340 can maintain the critical dimension delta to a range of approximately 15-20 nanometers for line widths varying from 200 nanometers to 1200 nanometers. The through pitch CD bias for a process without the low-pressure polymer burst 1340 can include a critical dimension delta range of approximately 15-40 nanometers for line widths varying from 200 nanometers to 1200 nanometers.

In the ARC/LTO open phase, the integrated circuit system 100, including the etch stop layer 216 and the layer stack 220, can be placed into a semiconductor processing chamber for further processing. The semiconductor processing chamber is a vacuum chamber that provides a controlled environment for the processing of semiconductor materials. Processing is the adding or removing of material to a substrate to create an integrated circuit. Processing can include etching, depositing, ion implantation, molecular beam epitaxy, reactive ion etching, chemical vapor deposition, or any combination thereof.

The etch stop layer 216 and the layer stack 220, including the photoresist layer 202, can be processed in the processing chamber using photolithographic techniques to burn the pattern mask on the photoresist layer 202. The exposed areas of the photoresist layer 202 can be removed leaving the resist lines including the first resist line 1202.

The etch stop layer 216 and the layer stack 220 can be exposed to the low-pressure polymer burst 1340 in the processing chamber. The low-pressure polymer burst 1340 is a plasma created by heating a non-oxidizing gas mixture 1342 until it forms a plasma in the processing chamber. The non-oxidizing gas mixture 1342 can be heated using resistive heating elements, radio-frequency (RF) heating, heat lamps, or any combination thereof.

The non-oxidizing gas mixture 1342 is a combination of an etchant gas mixture and a polymerizing gas mixture. The non-oxidizing gas mixture 1342 can include N2, H2, CH2F2, or any combination thereof. Preferentially, the non-oxidizing gas mixture 1342 can comprise an H2/N2 gas ratio range of between 3:1 and 5:1. The non-oxidizing gas mixture 1342 can also comprise combinations including N2/H2/CHF3, N2/H2/CH3F, N2/H2/C4F8, or any combination thereof.

The low-pressure polymer burst 1340 can be applied to the surface of the etch stop layer 216 and the layer stack 220 to form a first polymer layer 1302 over the first resist line 1202. The low-pressure polymer burst 1340 can etch and remove the portions of the anti-reflective coating layer 204 that are not protected by the first polymer layer 1302 over the first resist line 1202.

It has been further discovered that etching a portion of the anti-reflective coating layer 204 using the low-pressure polymer burst 1340 reduced the power requirement by reducing the time needed for the ARC open process. The forming of the first polymer layer 1302 using the low-pressure polymer burst 1340 in parallel with the etching of the anti-reflective coating layer 204 reduces the overall time needed for the ARC open process. The ARC open process time can be reduced by up to 55%.

The low-pressure polymer burst 1340 is applied to the surface of the substrate for a period of time sufficient to etch a portion of the anti-reflective coating layer 204. The amount of time the low-pressure polymer burst 1340 is applied to the etch stop layer 216 is defined by a polymer burst exposure time 1360. For example, the polymer burst exposure time 1360 can be approximately 5 seconds. The amount of time the low-pressure polymer burst 1340 is applied to the etch stop layer 216 is the exposure time when the plasma is ignited and sustained in the chamber. The maximum exposure time depends on the thickness of the anti-reflective coating layer 204 and how much critical dimension shrinkage is desired.

The low-pressure polymer burst 1340 is applied to the etch stop layer 216 with a specific pressure. A polymer burst pressure 1362 defines the pressure of the processing chamber. For example, the polymer burst pressure 1362 can be between 10 mTorr and 50 mTorr. Preferably the polymer burst pressure 1362 can be between 10 mTorr and 30 mTorr.

It has been discovered that the etching of the anti-reflective coating layer 204 using the low-pressure polymer burst 1340 shrinks the critical dimension of the opening between the adjacent resist lines by coating the resist lines with a polymer layer. The first polymer opening 1326 is smaller than the first resist line opening 1212 of FIG. 12, resulting in a small critical dimension for openings between resist lines. The low-pressure polymer burst 1340 helps shrink the critical dimension without affecting the though pitch CD bias. The shrinking of the critical dimension does not affect the through pitch CD bias where the resist lines are thicker due to the polymer layer, but the location of the resist lines remains constant, resulting in no change of the through line pitch 1352.

It has further been discovered that the etching of the anti-reflective coating layer 204 results in more consistent critical dimension delta compared to etching without the low-pressure polymer burst 1340 for varying resist line widths. The low-pressure polymer burst 1340 can reduce the amount of variation in the critical dimension delta from a range of approximately 15-40 nanometers to approximately 15-20 nanometers.

The low-pressure polymer burst 1340 can etch a portion of the anti-reflective coating layer 204 while also forming the first polymer layer 1302 on the first resist line 1202. The timing and duration of the low-pressure polymer burst 1340 is configured to remove part of the anti-reflective coating layer 204, but also to leave a layer of the anti-reflective coating layer 204 with a thickness of an anti-reflective coating layer thickness 1350.

Figure 14:
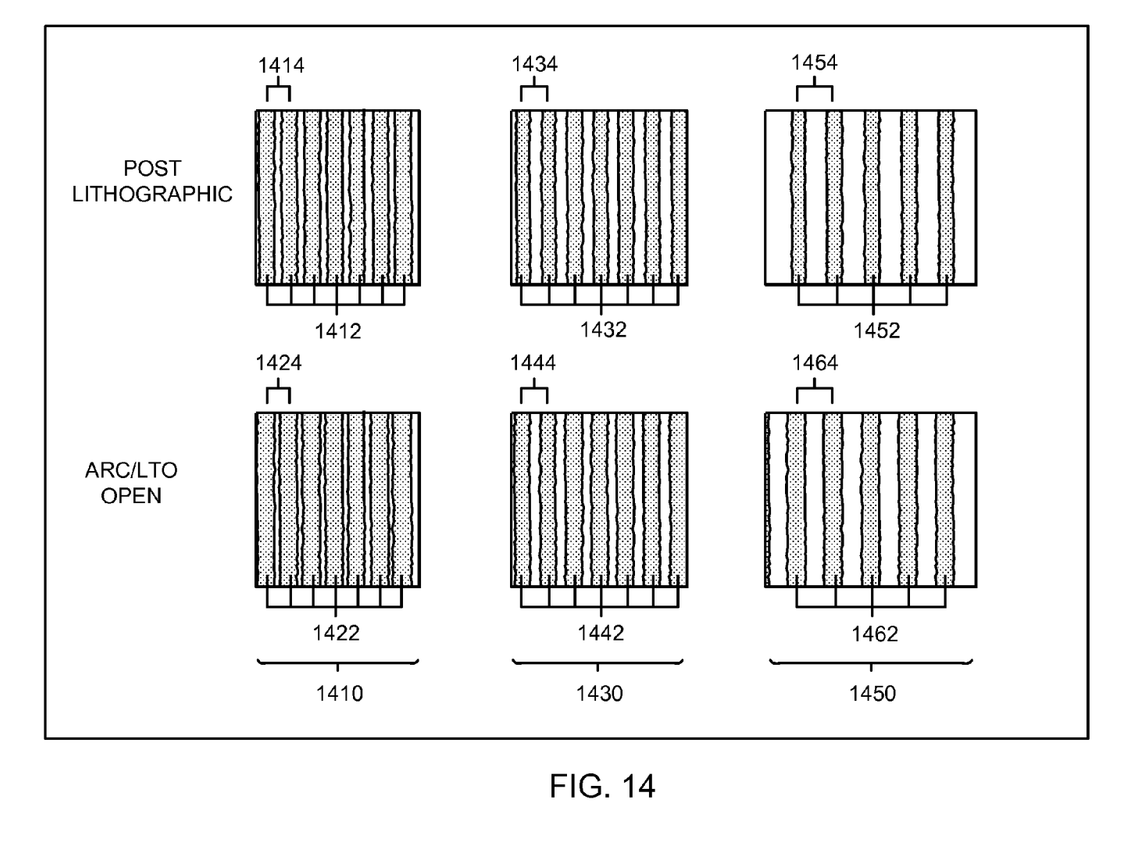
FIG. 14 is a diagram of the through line pitch of the integrated circuit system.

Referring now to FIG. 14, therein is shown a diagram of the through line pitch of the integrated circuit system 100. The diagram depicts the through pitch critical dimension at the post-lithographic stage and the ARC/LTO stage after the low-pressure polymer burst 1340 of FIG. 13.

The diagram of the integrated circuit system 100 includes a first example 1410. The first example 1410 includes a first resist line set 1412 and a first resist through line pitch 1414 in the post-lithographic stage. The first resist line set 1412 is used to cover a portion of the anti-reflective coating layer 204 of FIG. 2 to protect the anti-reflective coating layer 204 from further etching. The first resist through line pitch 1414 is the distance between the center lines of adjacent resist lines in the first resist line set 1412.

For example, the first resist line set 1412 can have a resist line width of approximately 62 nanometers. The first resist through line pitch 1414 can be approximately 100 nanometers.

The first example 1410 includes a first polymer line set 1422 and a first polymer through line pitch 1424 in the ARC/LTO open stage after the low-pressure polymer burst 1340 has formed a polymer layer over the first resist line set 1412. The first polymer line set 1422 is used to cover the first resist line set 1412 with a polymer coating from the low-pressure polymer burst 1340. The first polymer through line pitch 1424 is the distance between the center lines of adjacent polymer lines in the first polymer line set 1422.

In a further example, the first polymer line set 1422 can have a polymer line width of approximately 75 nanometers (nm). The first polymer through line pitch 1424 can be approximately 100 nanometers. Because the first polymer line set 1422 covers the first resist line set 1412, the first resist through line pitch 1414 is the same as the first polymer through line pitch 1424.

The diagram of the integrated circuit system 100 includes a second example 1430. The second example 1430 includes a second resist line set 1432 and a second resist through line pitch 1434 in the post-lithographic stage. The second resist line set 1432 is used to cover a portion of the anti-reflective coating layer 204 of FIG. 2 to protect the anti-reflective coating layer 204 from further etching. The second resist through line pitch 1434 is the distance between the center lines of adjacent resist lines in the second resist line set 1432.

For example, the second resist line set 1432 can have a resist line width of approximately 70 nanometers. The second resist through line pitch 1434 can be approximately 110 nanometers.

The second example 1430 includes a second polymer line set 1442 and a second polymer through line pitch 1444 in the ARC/LTO open stage after the low-pressure polymer burst 1340 has formed a polymer layer over the second resist line set 1432. The second polymer line set 1442 is used to cover the second resist line set 1432 with a polymer coating from the low-pressure polymer burst 1340. The second polymer through line pitch 1444 is the distance between the center lines of adjacent polymer lines in the second polymer line set 1442.

In a further example, the second polymer line set 1442 can have a polymer line width of approximately 108 nanometers. The second polymer through line pitch 1444 can be approximately 150 nanometers. Because the second polymer line set 1442 covers the second resist line set 1432, the second resist through line pitch 1434 is the same as the second polymer through line pitch 1444.

The diagram of the integrated circuit system 100 includes a third example 1450. The third example 1450 includes a third resist line set 1452 and a third resist through line pitch 1454 in the post-lithographic stage. The third resist line set 1452 is used to cover a portion of the anti-reflective coating layer 204 of FIG. 2 to protect the anti-reflective coating layer 204 from further etching. The third resist through line pitch 1454 is the distance between the center lines of adjacent resist lines in the third resist line set 1452.

For example, the third resist line set 1452 can have a resist line width of approximately 129 nanometers. The third resist through line pitch 1454 can be approximately 150 nanometers.

The third example 1450 includes a third polymer line set 1462 and a third polymer through line pitch 1464 in the ARC/LTO open stage after the low-pressure polymer burst 1340 has formed a polymer layer over the third resist line set 1452. The third polymer line set 1462 is used to cover the third resist line set 1452 with a polymer coating from the low-pressure polymer burst 1340. The third polymer through line pitch 1464 is the distance between the center lines of adjacent polymer lines in the third polymer line set 1462.

In a further example, the third polymer line set 1462 can have a polymer line width of approximately 89 nanometers. The third polymer through line pitch 1464 can be approximately 110 nanometers. Because the third polymer line set 1462 covers the third resist line set 1452, the third resist through line pitch 1454 is the same as the third polymer through line pitch 1464.

Figure 15:
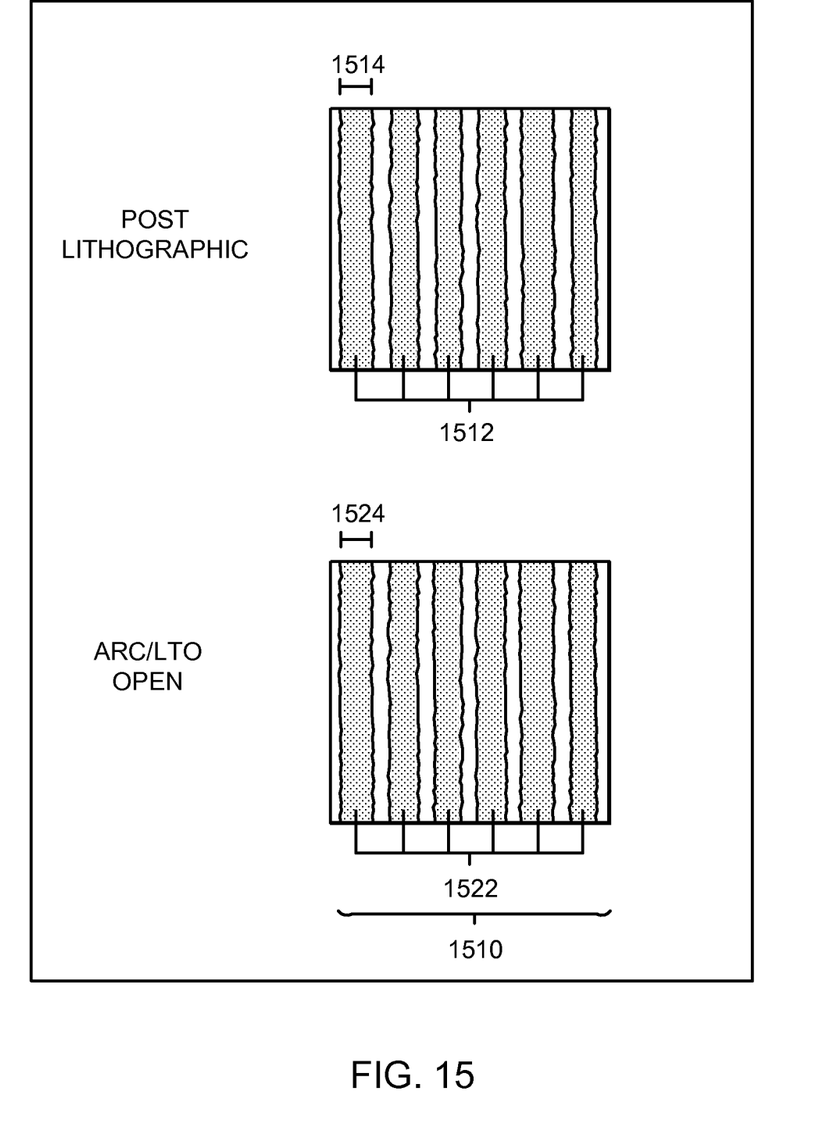
FIG. 15 is a diagram of the line edge roughness of the integrated circuit system.

Referring now to FIG. 15, therein is shown a diagram of the line edge roughness of the integrated circuit system 100. The diagram depicts the line edge roughness (LER) at the post-lithographic stage and the ARC/LTO stage after the low-pressure polymer burst 1340 of FIG. 13.

The diagram of the integrated circuit system 100 includes a LER example 1510. The LER example 1510 includes a first resist line set 1512 and a first resist line edge roughness 1514 in the post-lithographic stage.

The first resist line set 1512 is used to cover a portion of the anti-reflective coating layer 204 of FIG. 2 to protect the anti-reflective coating layer 204 from further etching. The first resist line edge roughness 1514 is the measure of the variation of the line edge from a straight edge of the first resist line set 1512. The first resist line edge roughness 1514 can be calculated by measuring the average line width roughness of the first resist line set 1512.

For example, the first resist line set 1512 can have an average line width roughness of approximately 5.5 nanometers. The first resist line set 1512 can have the first resist line edge roughness 1514 of approximately 1 nanometers.

A LER example 1520 includes a first polymer line set 1522 and a first polymer line edge roughness 1524 in the ARC/LTO open stage after the low-pressure polymer burst 1340.

The first polymer line set 1522 is used to cover a portion of the anti-reflective coating layer 204 of FIG. 2 to protect the anti-reflective coating layer 204 from further etching. The first polymer line edge roughness 1524 is the measure of the variation of the line edge from a straight edge of the first polymer line set 1522. The first polymer line edge roughness 1524 can be calculated by measuring the average line width roughness of the first polymer line set 1522.

For example, the first polymer line set 1522 can have an average line width roughness of approximately 5.0 nanometers. The first polymer line set 1522 can have the first polymer line edge roughness 1524 of approximately 0.8 nanometers.

Figure 16:
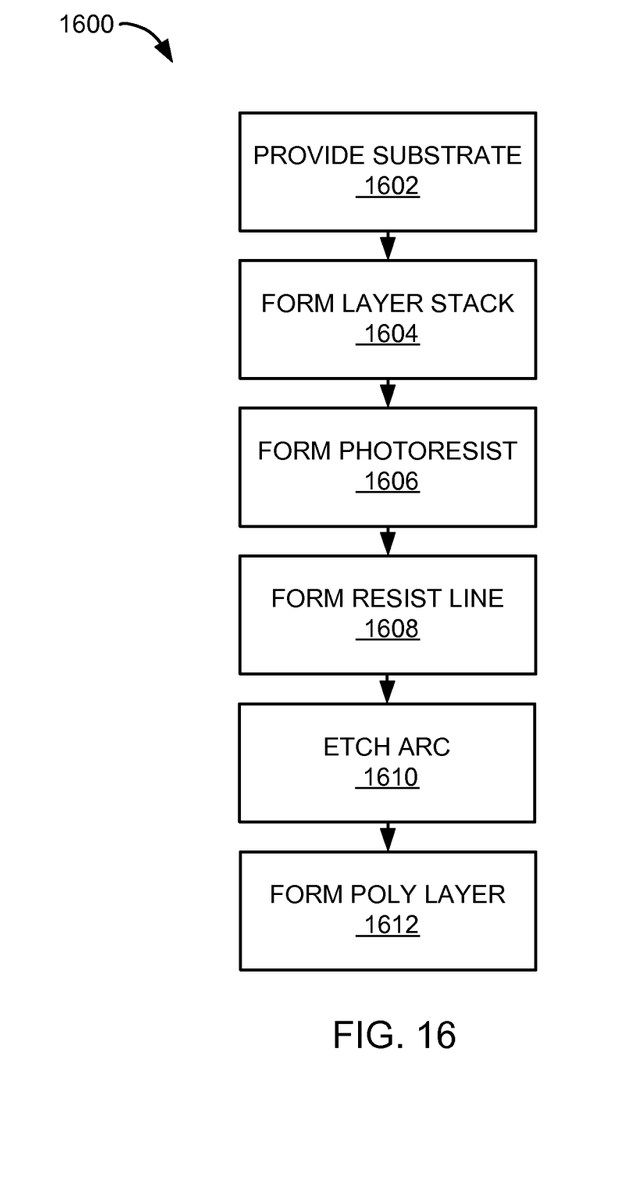
FIG. 16 is a method of manufacturing of the integrated circuit system in a further embodiment of the present invention.

Referring now to FIG. 16 therein is shown a method 1600 for manufacture of the integrated circuit system 100 in a further embodiment of the present invention. The method 1600 includes providing a substrate with the layer stack in a block 1602, forming the layer stack in a block 1604, forming a photoresist layer in a block 1606, forming a resist line in a block 1608, etching the anti-reflective coating layer in a block 1610, and forming a polymer layer in a block 1612.

It has been discovered that the present invention thus has numerous aspects.

It has also been discovered that the depositing of the first polymer layer 1302 on the first resist line 1202 reduces the level of line edge roughness (LER) of the first resist line 1202. Irregularities in the line edge of the first resist line 1202 can be covered by the first polymer layer 1302 resulting in a smoother edge for the combination of the first resist line 1202 and the first polymer layer 1302. The forming of the first polymer layer 1302 over the first resist line 1202 can also cover resist residues and scum left by earlier etching processes. The forming of the first polymer layer 1302 can improve the line edge roughness of the first resist line 1202 by smoothing out resist side wall roughness.

Another important aspect of the present invention is that the use of the non-oxidizing gas mixture 1342 to etch the anti-reflective coating layer 204 using the low-pressure polymer burst 1340 protects the ultra-low k dielectric layer 212 from oxidation effects that would result from the use of an oxidizing gas mixture. The non-oxidizing gas mixture 1342 prevents damage to the ultra-low k dielectric layer 212.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system method and apparatus of the present invention furnish important and heretofore unknown and unavailable solutions, capabilities, and functional aspects for integrated circuit systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit system comprising:
   an etch stop layer;
   a layer stack having an anti-reflective coating layer over a low temperature oxide layer;
   a photoresist layer over the anti-reflective coating layer;
   a first resist line and a second resist line etched from the photoresist layer with the first resist line and the second resist line separated by a through line pitch on the anti-reflective coating layer;
   the anti-reflective coating layer etched using a low-pressure polymer burst with a non-oxidizing gas mixture to remove a portion of the anti-reflective coating layer; and
   a first polymer layer over the first resist line.

2. The system as claimed in claim 1 wherein the low-pressure polymer burst has a polymer burst pressure of between 10 mTorr and 50 mTorr.

3. The system as claimed in claim 1 wherein the low-pressure polymer burst has a polymer burst exposure time of between 2 seconds and 10 seconds.

4. The system as claimed in claim 1 further comprising a passivation layer on the side of the first resist line.

5. The system as claimed in claim 1 wherein the layer stack includes:
   an ultra-low k dielectric layer over a portion of the etch stop layer;
   a hardmask layer over the ultra-low k layer;
   a planarizing layer over the hardmask layer; and
   the low temperature oxide layer over the planarizing layer.

6. The system as claimed in claim 1 further comprising a second polymer layer formed over the second resist line for reducing the critical dimension of a first polymer opening while keeping the through line pitch the same.

7. The system as claimed in claim 1 wherein the non-oxidizing gas mixture comprises N2 and H2 with more H2 than N2.

8. The system as claimed in claim 1 wherein the non-oxidizing gas mixture comprises CHF3, CH3F, or C4F8.

9. The system as claimed in claim 1 wherein the non-oxidizing gas mixture comprises CH2F2.

10. The system as claimed in claim 1 wherein the photoresist layer includes the photoresist layer etched with a reactive ion etching process.

11. A method of manufacture of an integrated circuit system comprising:
    providing an etch stop layer;
    forming a layer stack over the etch stop layer with the layer stack having an anti-reflective coating layer over a low temperature oxide layer;
    forming a photoresist layer over the anti-reflective coating layer;
    forming a first resist line and a second resist line from the photoresist layer with the first resist line and the second resist line separated by a through line pitch on the anti-reflective coating layer;
    etching the anti-reflective coating layer using a low-pressure polymer burst with a non-oxidizing gas mixture to remove a portion of the anti-reflective coating layer; and
    forming a first polymer layer over the first resist line.

12. The method as claimed in claim 11 wherein etching the anti-reflective coating layer includes using the low-pressure polymer burst with a polymer burst pressure of between 10 mTorr and 30 mTorr.

13. The method as claimed in claim 11 wherein etching the anti-reflective coating layer includes using the low-pressure polymer burst with a polymer burst exposure time of between 2 seconds and 10 seconds.

14. The method as claimed in claim 11 further comprising forming a passivation layer on the side of the first resist line.

15. The method as claimed in claim 11 wherein forming the layer stack includes:
   forming an ultra-low k dielectric layer over a portion of the etch stop layer;
   forming a hardmask layer over the ultra-low k layer;
   forming a planarizing layer over the hardmask layer; and
   forming the low temperature oxide layer over the planarizing layer.

16. A method of manufacture of an integrated circuit system comprising:
   providing an etch stop layer;
   forming a layer stack over the etch stop layer with the layer stack having an anti-reflective coating layer over a low temperature oxide layer;
   forming a photoresist layer over the anti-reflective coating layer;
   forming a first resist line and a second resist line from the photoresist layer with the first resist line and the second resist line separated by a through line pitch on the anti-reflective coating layer;
   etching the anti-reflective coating layer using a low-pressure polymer burst with a non-oxidizing gas mixture to remove a portion of the anti-reflective coating layer; and
   forming a first polymer layer over the first resist line; and
   forming a second polymer layer over the second resist line for reducing the critical dimension of a first polymer opening while keeping the through line pitch the same.

17. The method as claimed in claim 16 wherein etching the anti-reflective coating layer includes using the non-oxidizing gas mixture comprises N2 and H2 with more N2 than H2.

18. The method as claimed in claim 16 wherein etching the anti-reflective coating layer includes using the non-oxidizing gas mixture comprises H2.

19. The method as claimed in claim 16 wherein etching the anti-reflective coating layer includes using the non-oxidizing gas mixture comprises CH2F2.

20. The method as claimed in claim 16 wherein etching the photoresist layer includes etching the photoresist layer with a reactive ion etching process.

* * * * *